(12) United States Patent
Tomizawa et al.

(10) Patent No.: US 11,276,552 B2
(45) Date of Patent: Mar. 15, 2022

(54) METHOD FOR IMAGE ADJUSTMENT AND CHARGED PARTICLE BEAM SYSTEM

(71) Applicant: Hitachi High-Tech Corporation, Tokyo (JP)

(72) Inventors: Yuki Tomizawa, Tokyo (JP); Kazunari Asao, Tokyo (JP); Kazuyuki Hirao, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/951,472

(22) Filed: Nov. 18, 2020

(65) Prior Publication Data

US 2021/0183611 A1    Jun. 17, 2021

(30) Foreign Application Priority Data

Dec. 12, 2019   (JP) .............................. JP2019-224714

(51) Int. Cl.
*H01J 37/22*    (2006.01)
*H01J 37/21*    (2006.01)
(Continued)

(52) U.S. Cl.
CPC ............ *H01J 37/222* (2013.01); *G06T 5/008* (2013.01); *H01J 37/21* (2013.01); *H01J 37/28* (2013.01);
(Continued)

(58) Field of Classification Search
CPC .......... H01J 37/222; H01J 37/21; H01J 37/28; H01J 37/285; H01J 2237/2806; G06T 5/008; G06T 2200/24; G06T 2207/10061
(Continued)

(56) References Cited

U.S. PATENT DOCUMENTS

2004/0232332 A1   11/2004  Konno et al.
2005/0253067 A1   11/2005  Kawada et al.
(Continued)

FOREIGN PATENT DOCUMENTS

JP    2004-349515 A    12/2004
JP    2005-327578 A    11/2005
(Continued)

OTHER PUBLICATIONS

Taiwanese-language Office Action issued in Taiwan Application No. 109135443 dated Oct. 26, 2021 (seven (7) pages).

*Primary Examiner* — Nicole M Ippolito
(74) *Attorney, Agent, or Firm* — Crowell & Moring LLP

(57) ABSTRACT

There are provided: a method for image adjustment using a charged particle beam device, and a charged particle beam system, capable of appropriately adjusting a contrast and brightness as well as a focus for a measurement region present in a deep portion of a sample even when a depth of the measurement region is unknown.

A method for image adjustment performed by a computer system controlling a charged particle beam device includes: by the computer system, specifying a measurement region from a captured image of a sample; performing centering processing based on the specified measurement region; extracting the measurement region in a field of view that has undergone the centering processing or the image that has undergone the centering processing; adjusting a contrast and brightness for the extracted measurement region; and adjusting a focus for the measurement region in which the contrast and brightness have been adjusted.

16 Claims, 15 Drawing Sheets

(51) Int. Cl.
  *H01J 37/28* (2006.01)
  *G06T 5/00* (2006.01)
  *H01J 37/285* (2006.01)
(52) U.S. Cl.
  CPC ........ *H01J 37/285* (2013.01); *G06T 2200/24* (2013.01); *G06T 2207/10061* (2013.01); *H01J 2237/2806* (2013.01)
(58) Field of Classification Search
  USPC .................. 250/306, 307, 309, 310, 311
  See application file for complete search history.

(56) References Cited

U.S. PATENT DOCUMENTS

| | | | | |
|---|---|---|---|---|
| 2008/0130982 | A1* | 6/2008 | Kitamura | G06T 7/001 382/144 |
| 2015/0076348 | A1* | 3/2015 | Konishi | H01J 37/28 250/310 |
| 2015/0228443 | A1* | 8/2015 | Morita | H01J 37/141 250/310 |
| 2015/0332891 | A1 | 11/2015 | Bierhoff et al. | |
| 2019/0279841 | A1 | 9/2019 | Xiao | |

FOREIGN PATENT DOCUMENTS

| | | |
|---|---|---|
| JP | 2014-139543 A | 7/2014 |
| JP | 2016-25048 A | 2/2016 |

\* cited by examiner

[FIG. 1]
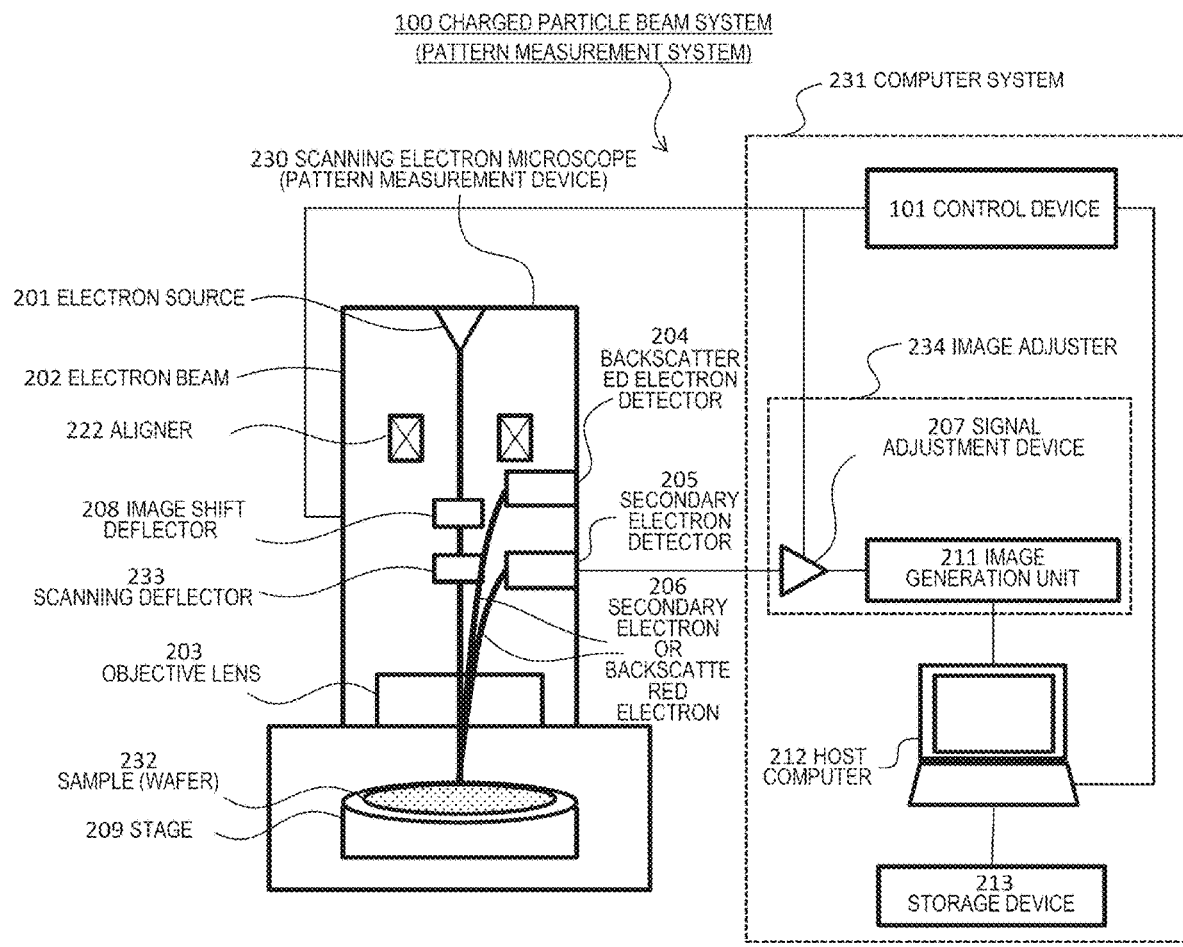

[FIG. 2]
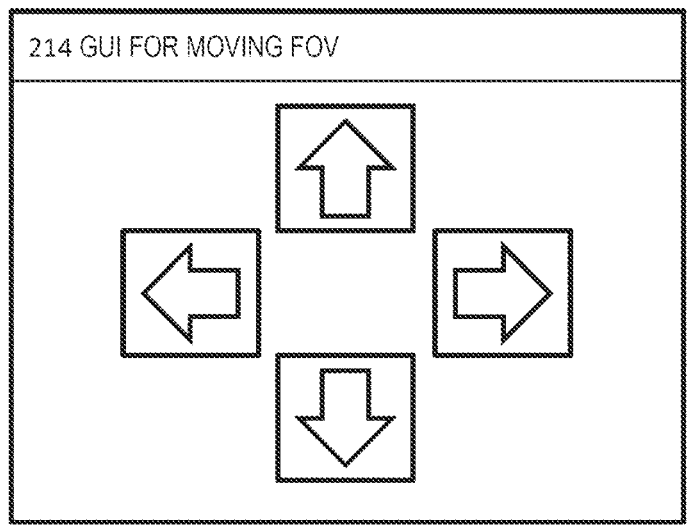
[FIG. 3]
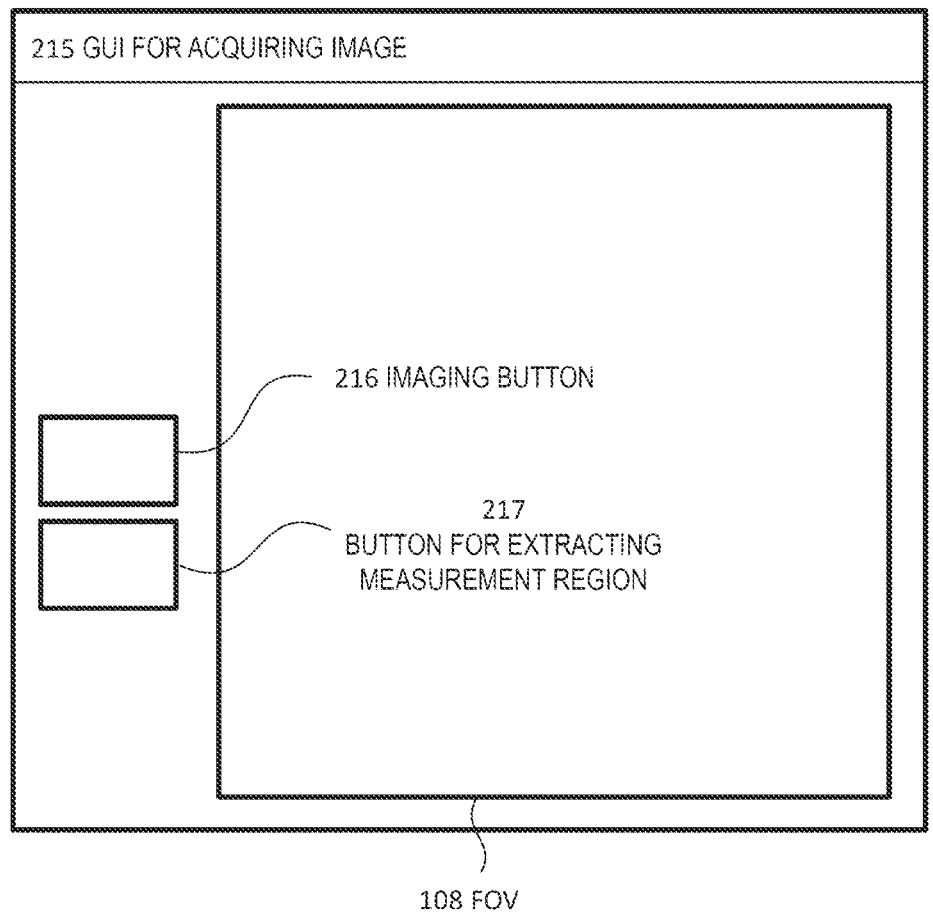

[FIG. 4]
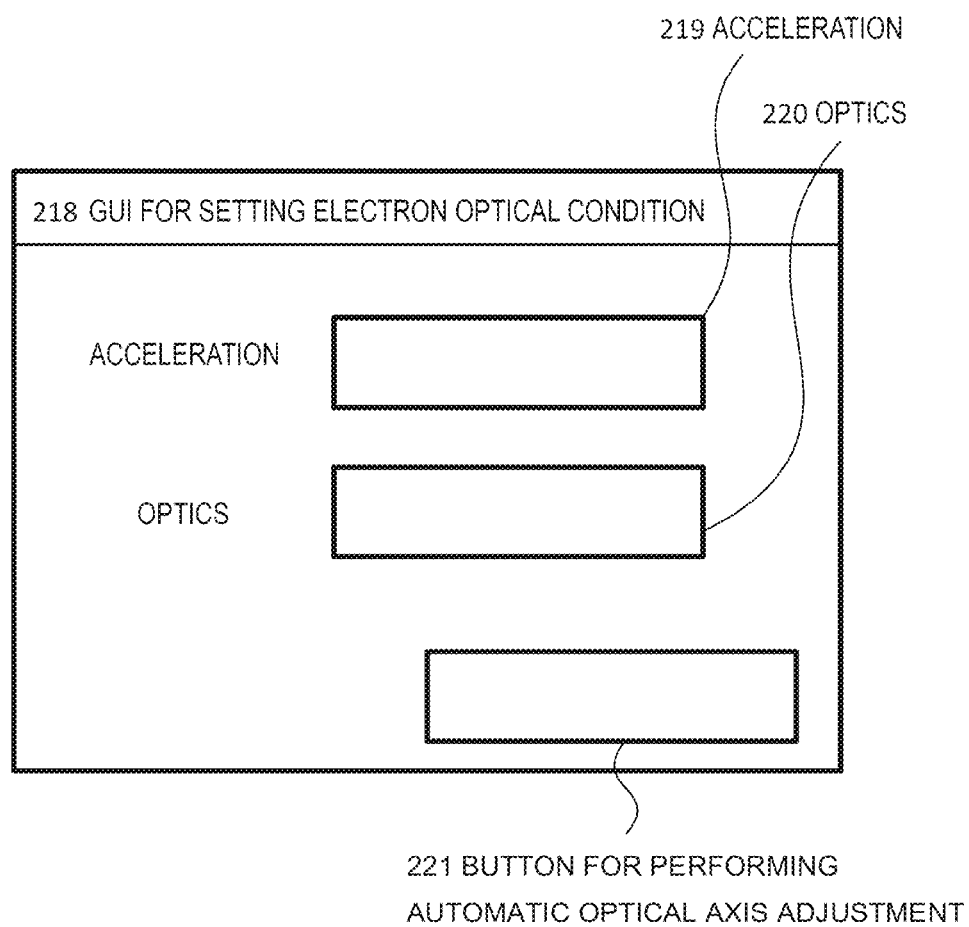

[FIG. 6]
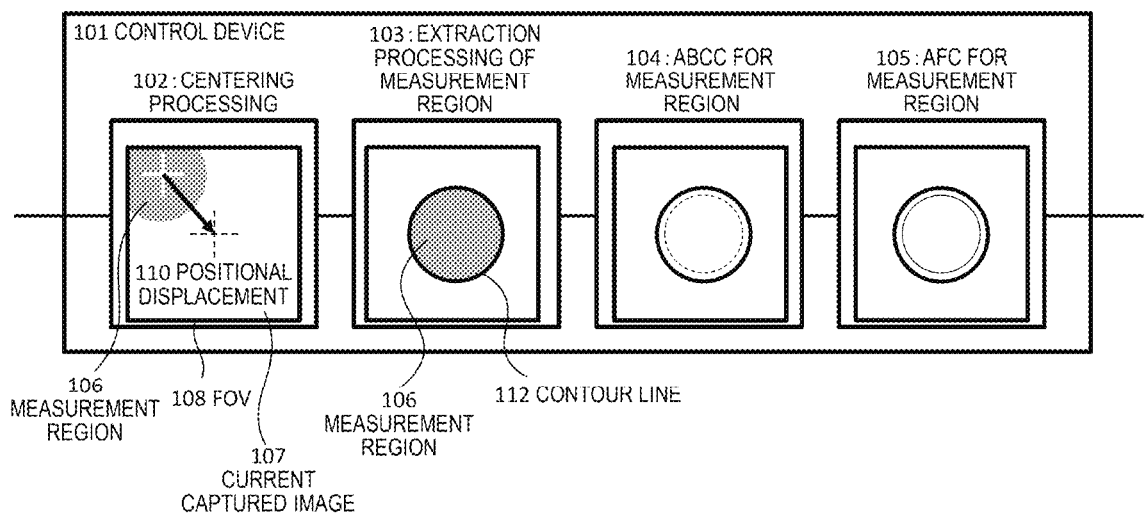

[FIG. 7]
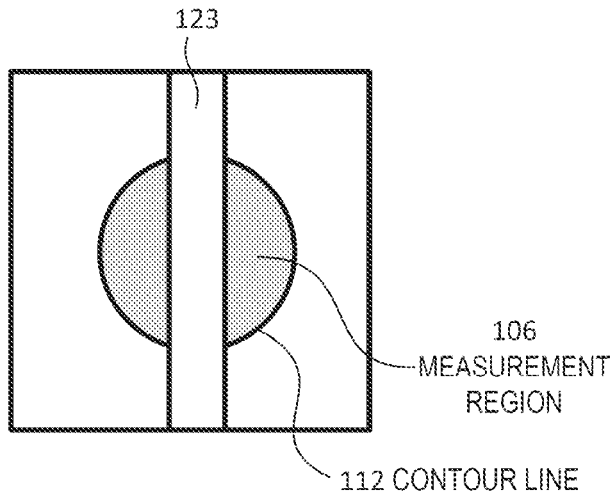
[FIG. 8]
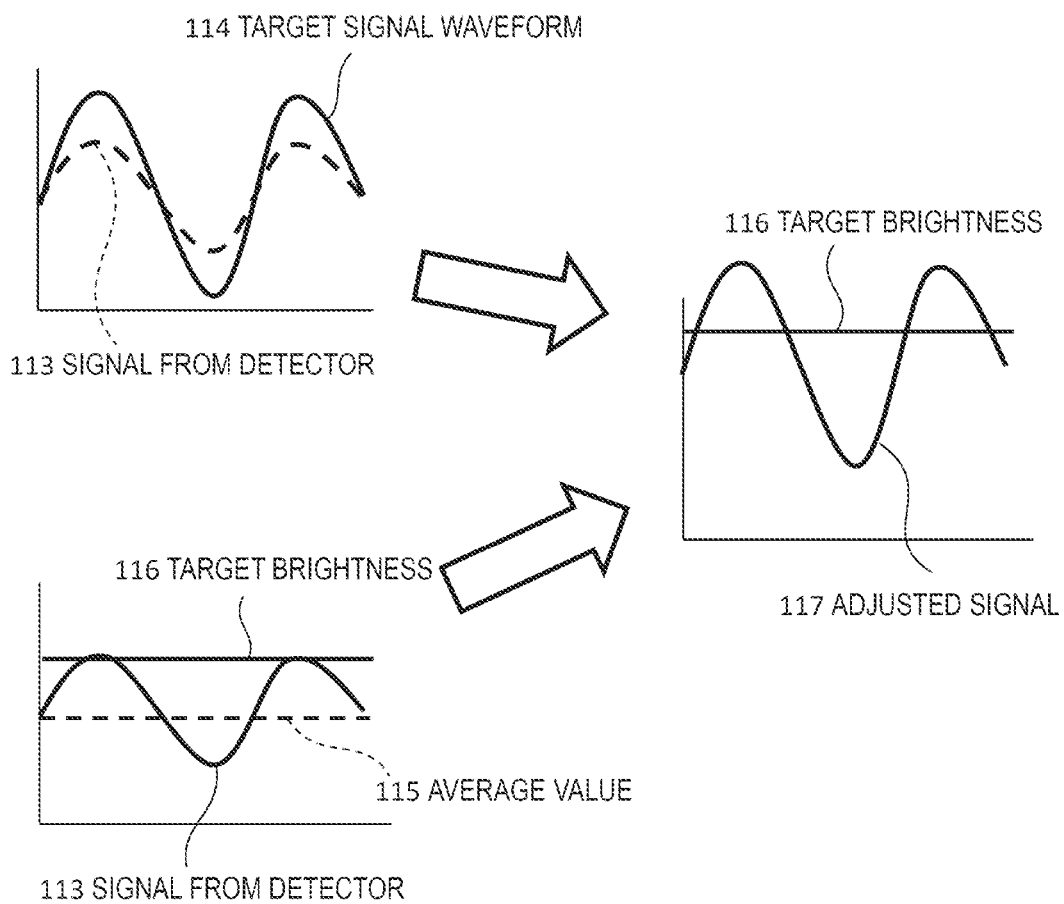

[FIG. 9]
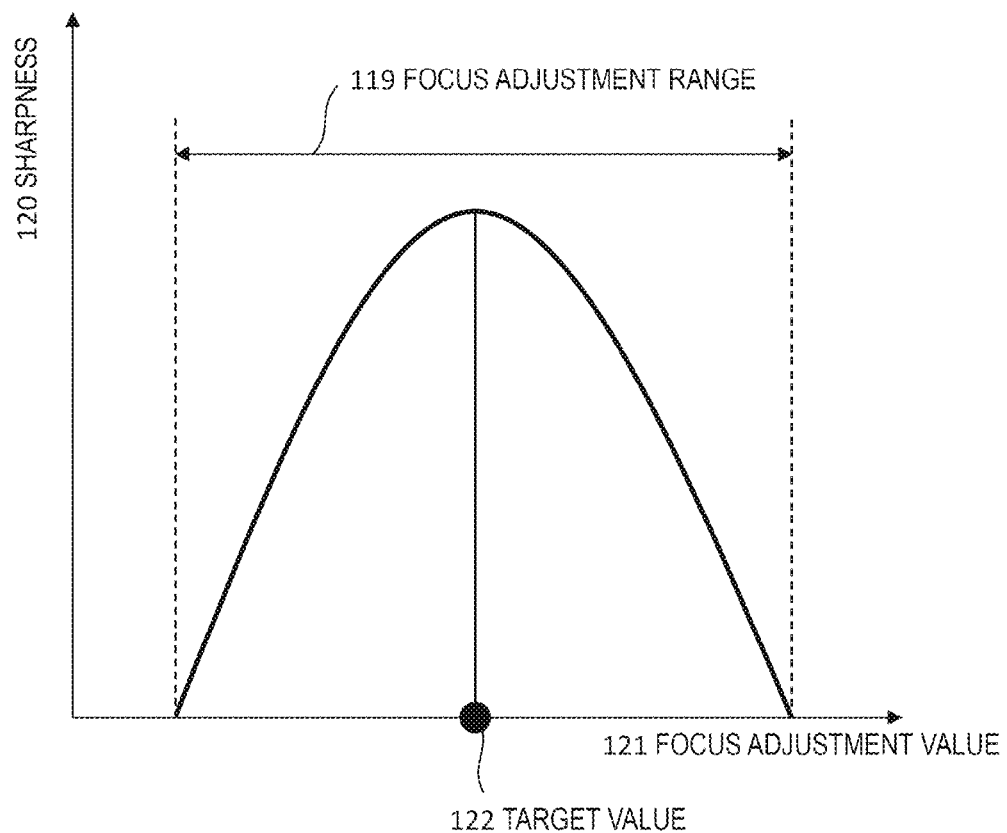
[FIG. 10]
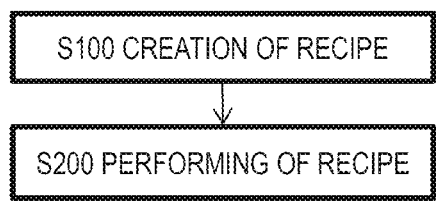

[FIG. 11]
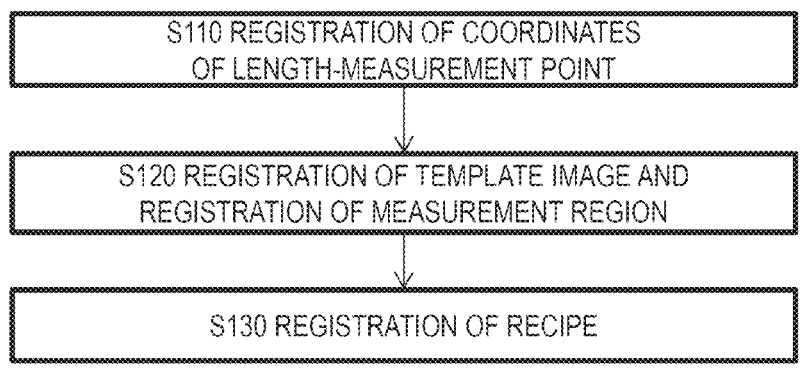
[FIG. 12]
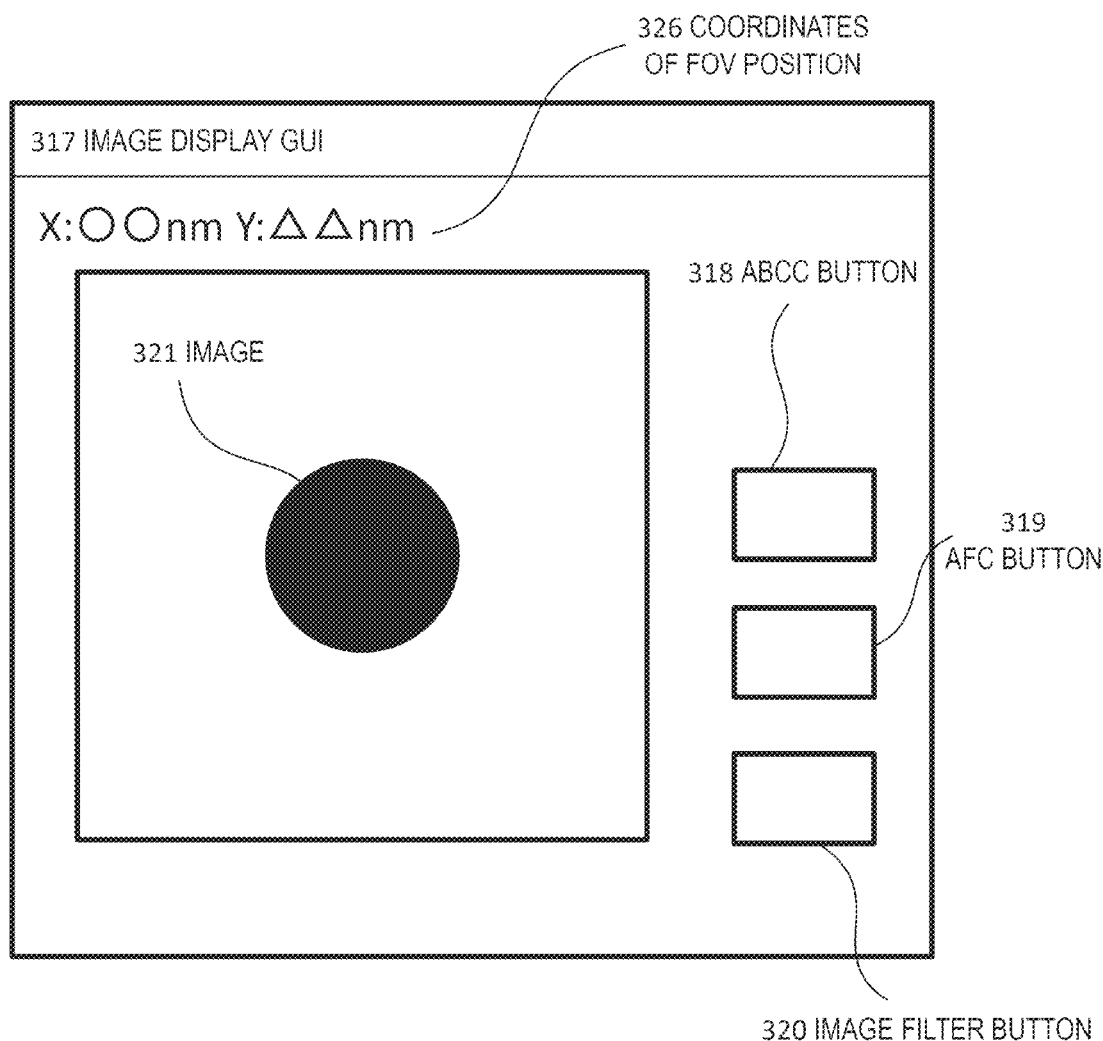

[FIG. 13]
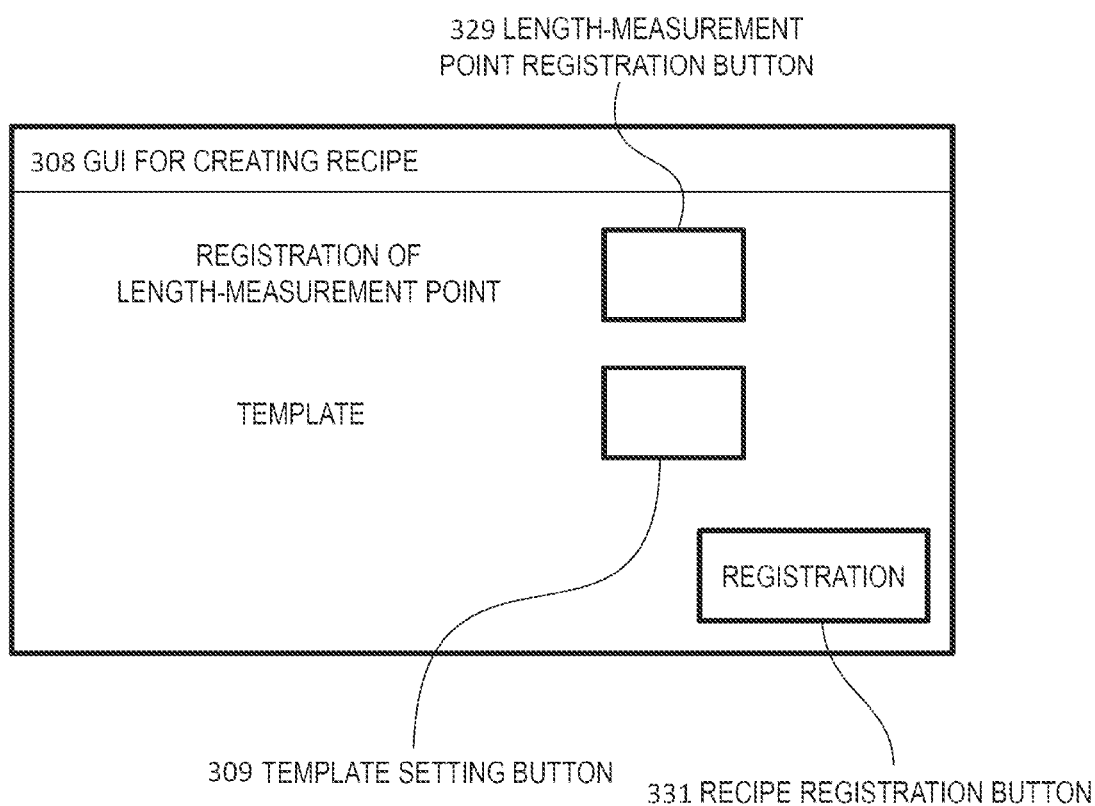

[FIG. 14]
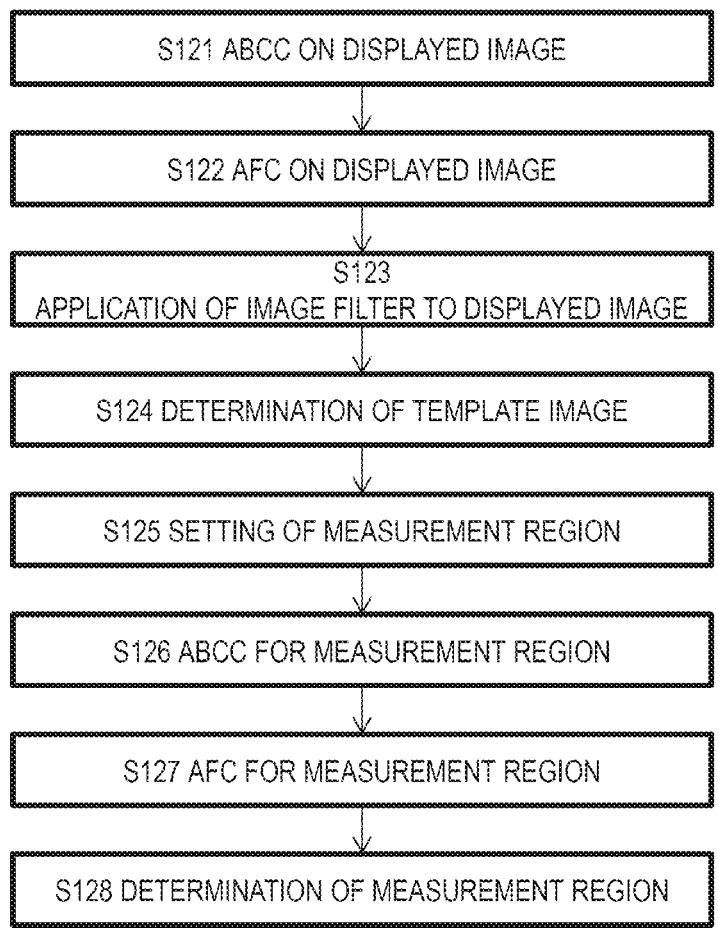

[FIG. 15]
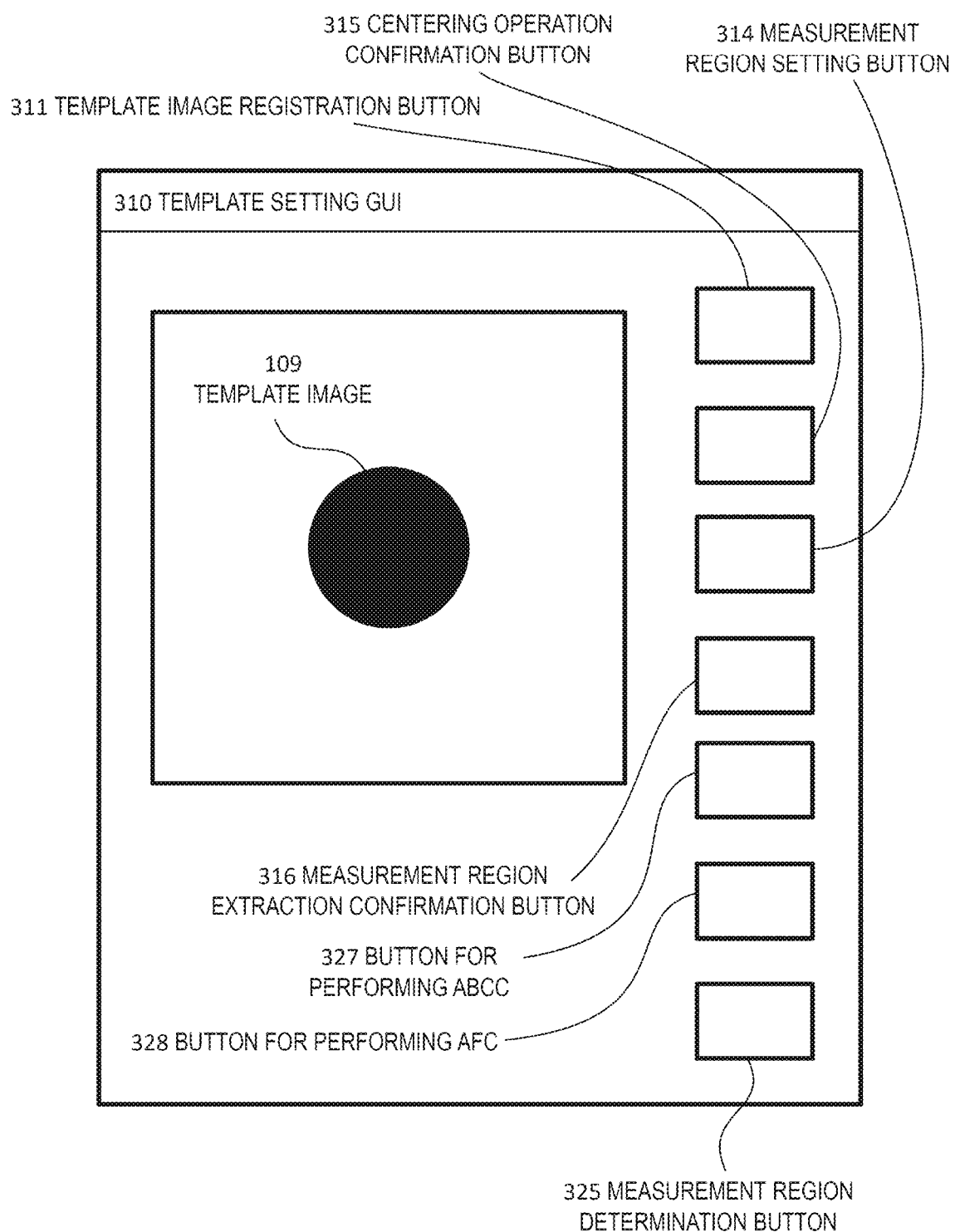

[FIG. 16]
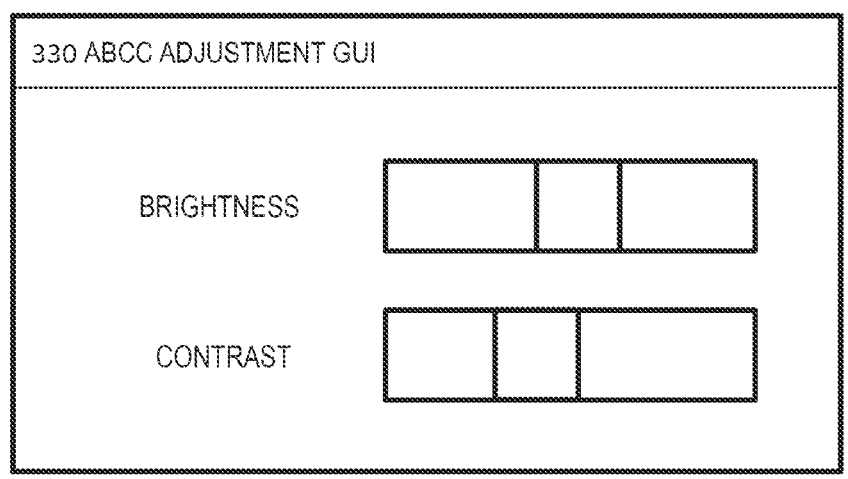

[FIG. 17]
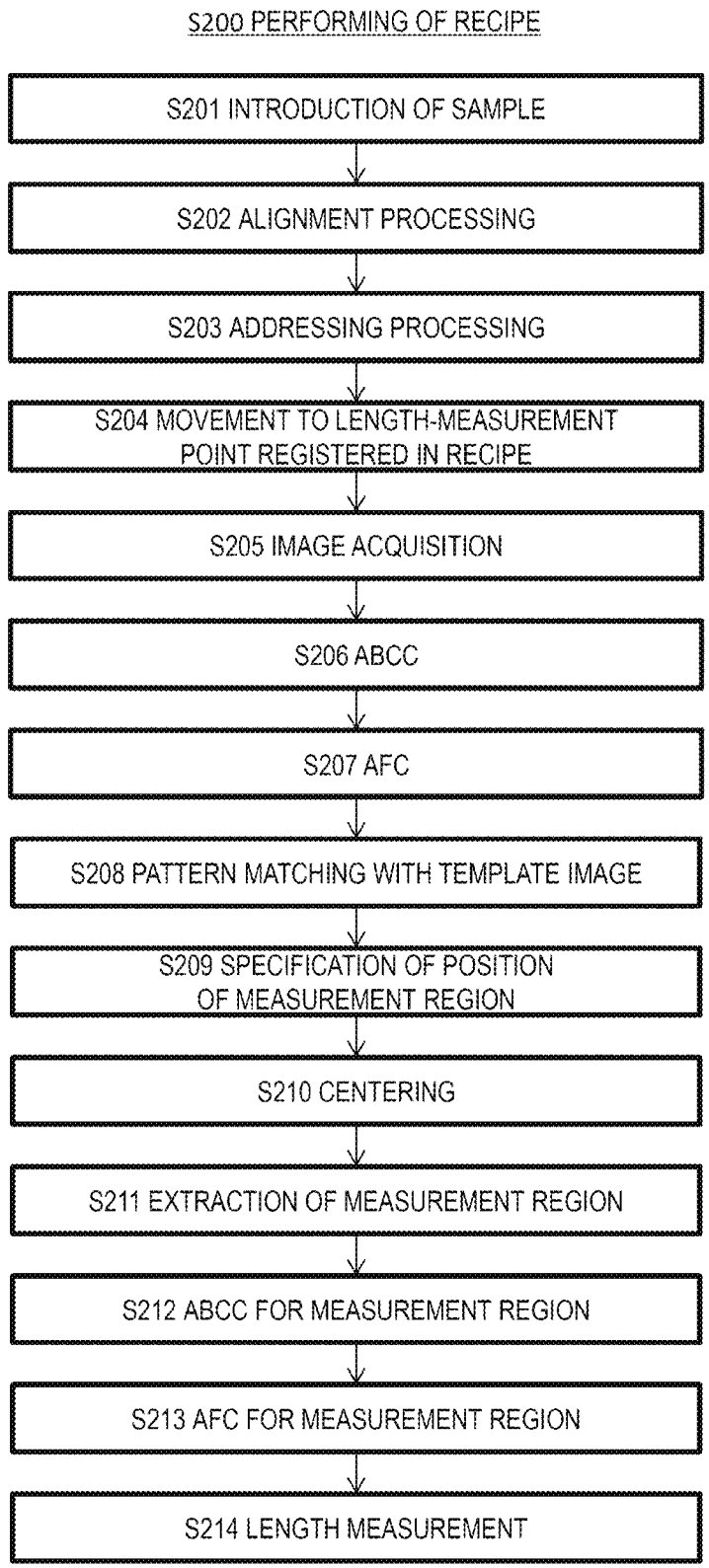

[FIG. 18]
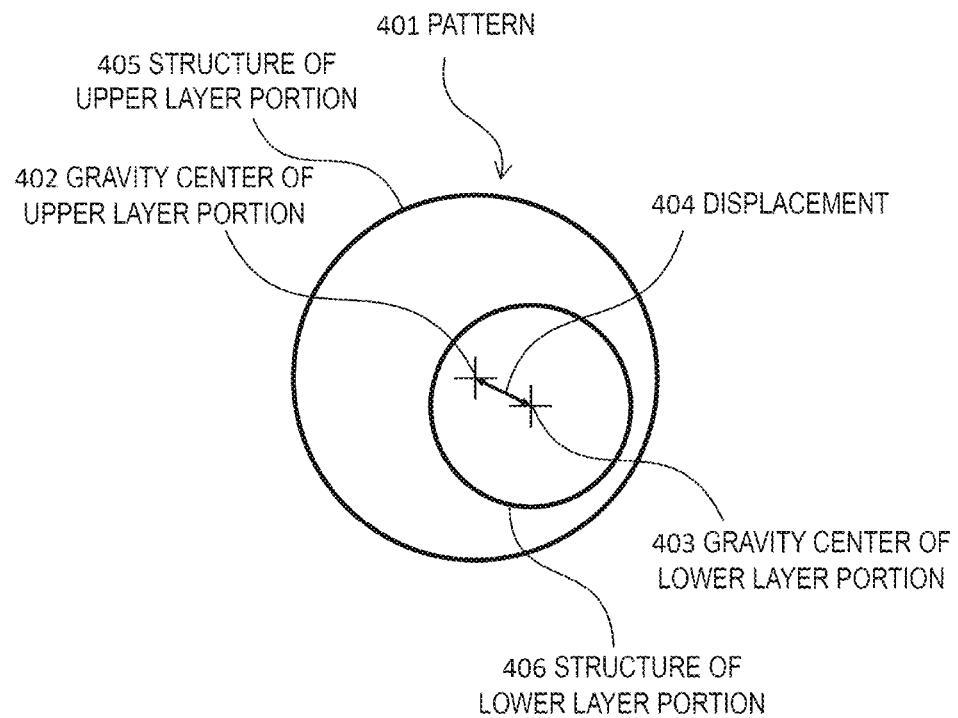
[FIG. 19]
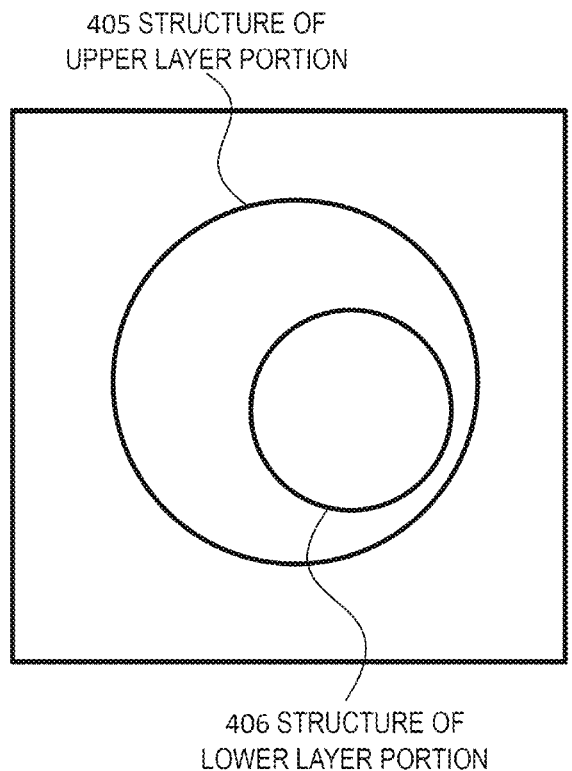

[FIG. 20]

| IMAGE NAME | DETECTOR |
|---|---|
| IMAGE OF UPPER LAYER PORTION | SECONDARY ELECTRON DETECTOR |
| IMAGE OF LOWER LAYER PORTION | BACKSCATTERED ELECTRON DETECTOR |

407 RECIPE CREATION GUI FOR OVERLAY MEASUREMENT

SETTING OF OVERLAY MEASUREMENT

METHOD FOR IMAGE ADJUSTMENT AND CHARGED PARTICLE BEAM SYSTEM

TECHNICAL FIELD

The present disclosure relates to a method for image adjustment and a charged particle beam system, and particularly relates to those that adjust a contrast and brightness as well as a focus.

BACKGROUND ART

In manufacturing and inspection processes of a functional element product such as a semiconductor memory in which a fine circuit pattern is present inside a deep hole or a deep groove on a surface, a scanning electron microscope (hereinafter sometimes abbreviated as "SEM") has been widely used for measuring a width of the processed pattern and visual inspection. The SEM is a device that scans a sample with an electron beam and detects secondary electrons or backscattered electrons emitted from the sample (hereinafter, collectively referred to as "secondary charged particles") to form an image of a scanned region. The SEM can capture an image of a pattern of a sample to be measured, and calculates a distance between any two points from the acquired image. This calculation is generally called "length measurement", and the scanning electron microscope having this calculation function is called a length-measurement electron microscope (critical dimension SEM: CD-SEM). In PTL 1, a charged particle beam device such as the CD-SEM performs automatic adjustment of a contrast and brightness (auto brightness and contrast control, hereinafter abbreviated as "ABCC"), and automatic adjustment of a focus (auto focus control, hereinafter abbreviated as "AFC"). In order to accurately measure a length, it is necessary to use an image whose state has been adjusted by these automatic adjustment functions.

Examples of image adjustment technologies in such a charged particle beam device are disclosed in PTLs 1 to 3.

CITATION LIST

Patent Literature

PTL 1: JP-A-2005-327578
PTL 2: JP-A-2014-139543
PTL 3: JP-A-2016-025048

SUMMARY OF INVENTION

Technical Problem

However, the related-art technology has a problem that an image of a pattern present in a deep portion of the sample cannot be clearly captured.

In recent years, patterns formed on the sample have been stacked, and there is a need to measure a width of the pattern present in the deep portion. However, since a signal amount of secondary charged particles from a pattern present on the surface is generally larger than a signal amount of secondary charged particles from the pattern present in the deep portion, when the ABCC and AFC are performed, adjustments are made such that only a surface of the pattern becomes clear, and the image of the pattern present in the deep portion cannot be clearly captured, resulting in inaccurate length measurement. Although the focus can also be adjusted by specifying an offset in a depth direction after focusing on the pattern on the surface, such a method requires accurate information about a depth, and the image cannot be clearly captured when the depth is unknown.

Therefore, an object of the disclosure is to provide a method for image adjustment and a charged particle beam system capable of acquiring a clear image by appropriately adjusting a contrast and brightness as well as a focus for a measurement region present in a deep portion of a sample even when a depth of the measurement region is unknown.

Solution to Problem

An aspect of a method for image adjustment according to the disclosure is a method for image adjustment performed by a computer system controlling a charged particle beam device, the method for image adjustment including:
by the computer system, performing scanning on a sample with a charged particle beam;
by the computer system, acquiring a signal corresponding to charged particles emitted from the sample during the scanning;
by the computer system, acquiring an image by adjusting the signal;
by the computer system, acquiring a measurement region in the image; and
by the computer system, adjusting a focus for the measurement region.

An aspect of a charged particle beam system according to the disclosure is a charged particle beam system including: a charged particle beam device; and a computer system, in which
the computer system is configured to, by controlling the charged particle beam device,
perform scanning on a sample with a charged particle beam,
acquire a signal corresponding to charged particles emitted from the sample during the scanning,
acquire an image by adjusting the signal,
acquire a measurement region in the image, and
adjust a focus for the measurement region.

Advantageous Effect

According to the method for image adjustment and the charged particle beam system according to the disclosure, the contrast and brightness as well as the focus can be appropriately adjusted for the measurement region present in the deep portion of the sample even when the depth of the measurement region is unknown.

BRIEF DESCRIPTION OF DRAWINGS

FIG. 1 is a diagram showing a configuration of a charged particle beam device according to a first embodiment of the disclosure.

FIG. 2 is a diagram showing a configuration of a GUI for moving an FOV in the first embodiment.

FIG. 3 is a diagram showing a configuration of a GUI for acquiring an image in the first embodiment.

FIG. 4 is a diagram showing a configuration of a GUI for setting an electron optical condition in the first embodiment.

FIG. 6 is a functional schematic diagram showing a part of image-related functions of a control device provided in the charged particle beam device according to the first embodiment.

FIG. 7 is a diagram showing a state in which a part of a measurement region of a sample is covered with an upper layer pattern.

FIG. 8 is a diagram for explaining an operation of an ABCC according to the first embodiment.

FIG. 9 is a diagram for explaining an operation of an AFC according to the first embodiment.

FIG. 10 is a flowchart showing an outline of processing performed by a charged particle beam device in order to extract a measurement region in a second embodiment.

FIG. 11 is a flowchart showing contents of step S100 in FIG. 10 in more detail.

FIG. 12 is a diagram showing a configuration of an image display GUI used in step S110 in FIG. 11.

FIG. 13 is a diagram showing a configuration of a GUI for creating a recipe, which is used in step S110 in FIG. 11.

FIG. 14 is a flowchart showing contents of step S120 in FIG. 11 in more detail.

FIG. 15 is a diagram showing a configuration of a template setting GUI used in step S120 in FIG. 11.

FIG. 16 is a diagram showing a configuration of an ABCC adjustment GUI used in step S126 in FIG. 14.

FIG. 17 is a flowchart showing contents of step S200 in FIG. 10 in more detail.

FIG. 18 is a diagram for explaining overlay measurement according to a third embodiment.

FIG. 19 is an example of an image acquired corresponding to a pattern in FIG. 18.

FIG. 20 is a diagram showing a configuration of a recipe creation GUI for the overlay measurement according to the third embodiment.

DESCRIPTION OF EMBODIMENTS

Figure 5A:
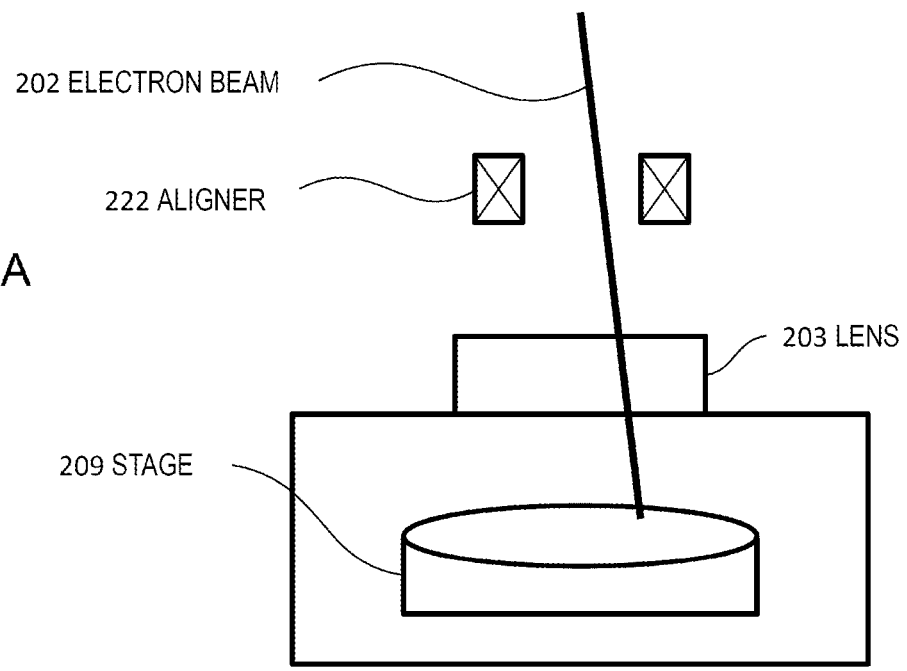
FIGS. 5A and 5B are diagrams for explaining an action of an aligner according to the first embodiment.

Hereinafter, embodiments will be described with reference to accompanying drawings. In the accompanying drawings, functionally the same elements may be displayed with the same or corresponding numbers. Although the accompanying drawings show specific embodiments and implementation examples in accordance with principles of the disclosure, they are for a purpose of understanding of the disclosure and are not to be used for limiting interpretation of the disclosure. Descriptions in this specification are merely exemplary, and are not intended to limit the scope of the claims or application examples of the disclosure in any sense.

It is necessary to understand that the present embodiment is described insufficient detail for those skilled in the art to perform the disclosure, but other implementations and aspects are possible, and a configuration and a structure can be changed and various elements can be replaced without departing from the scope and the spirit of the technical idea of the disclosure. Therefore, the following description should not be construed as being limited to the present embodiment.

The following description of the embodiment shows an example in which the disclosure is applied to a charged particle beam system (a pattern measurement system) including a scanning electron microscope (SEM) using an electron beam and a computer system. However, this embodiment should not be construed in a limited way, and the disclosure may also be applied to, for example, a device that uses a charged particle beam such as an ion beam, as well as a general observation device.

In the embodiment described below, a pattern measurement device that measures a pattern on a sample (a semiconductor wafer) will be described as an example of the scanning electron microscope, but the "scanning electron microscope" broadly includes a device that captures an image of a sample using an electron beam. Other examples of the scanning electron microscope include an inspection device that uses a scanning electron microscope, a review device, a general-purpose scanning electron microscope, a sample processing device or a sample analysis device including a scanning electron microscope, and the like, and the disclosure can be applied to these devices. In the embodiment described below, the scanning electron microscope includes a system in which the scanning electron microscope is connected via a network or a composite device in which a plurality of scanning electron microscopes are combined.

In functions, an operation, processing and a flow according to the embodiment described below, elements or the flow of steps will be described mainly with "charged particle beam system", "control device" and "host computer" as subjects (operation main bodies), and the explanation may be based on a subject (an operation main body) of "computer system", or the explanation may be based on a subject (an operation main body) of "various programs" performed by the computer system. A part or all of the programs may be implemented by dedicated hardware, or may be modularized. The various programs may be installed in the computer system by a program distribution server or storage media. The embodiment of the disclosure may be implemented by software running on a general-purpose computer, or may be implemented by dedicated hardware or a combination of software and hardware.

In the embodiment described below, the "sample" will be described as an example of the semiconductor wafer on which a pattern is formed, but the disclosure is not limited thereto, and the "sample" may be a metal, a ceramic, a biological sample or the like.

In the embodiment described below, "measurement" in the scanning electron microscope that measures the pattern on the semiconductor wafer will be described as an example of measuring a dimension of the pattern on the semiconductor wafer. However, the disclosure is not limited thereto, and the "measurement" may be observation or inspection of the pattern.

In the embodiment described below, "centering processing" refers to, for example, processing of positioning a measurement region in or near a center in an image or a field of view, and may mean at least processing of positioning the entire measurement region in the image or in the field of view.

Although focus adjustment of an electron beam described below will be described in the embodiment in which an excitation current of an objective lens is controlled, the focus adjustment may be performed using a lens or an electrode other than the objective lens, or the focus adjustment of the electron beam may be performed by adjusting a negative voltage (a retarding voltage) applied to the sample, which is so-called retarding focus adjustment.

First Embodiment

FIG. 1 shows a configuration of a charged particle beam system (a pattern measurement system) 100 according to a first embodiment of the disclosure. The charged particle beam system 100 includes a scanning electron microscope (a pattern measurement device) 230 and a computer system 231, and performs a method for image adjustment according to the present embodiment.

The scanning electron microscope 230 is an example of a charged particle beam device. The computer system 231 controls the scanning electron microscope 230 and performs the method for image adjustment using the scanning electron microscope 230.

The scanning electron microscope 230 includes an electron source 201 that emits an electron beam 202 as charged particles, an aligner 222 that adjusts an optical axis of the electron beam 202, an objective lens 203 that adjusts a focal position of the electron beam 202 with respect to a sample (a wafer) 232, and a detector that detects secondary electrons or backscattered electrons 206 as charged particles emitted from the sample. The detector includes a backscattered electron detector 204 that detects the backscattered electrons from the sample and a secondary electron detector 205 that detects the secondary electrons emitted from the sample (the wafer) 232.

The scanning electron microscope 230 includes a scanning deflector 233 that performs scanning with the electron beam 202 with which the sample (the wafer) 232 is irradiated, an image shift deflector 208 that deflects the electron beam 202, and a stage 209 on which the sample (the wafer) 232 is placed. The image shift deflector 208 and the stage 209 constitute a field of view (FOV) position adjustment mechanism (not shown) that adjusts a region displayed in an FOV with respect to the sample. The FOV position adjustment mechanism may include only one of the image shift deflector 208 and the stage 209.

The scanning electron microscope 230 may include other lenses and electrodes in addition to these, or a detection system may include other detectors. In addition, configurations of an electron optical system and the detection system may be partially different from components described above, and are not limited to the above configurations.

The computer system 231 includes a signal adjustment device 207 that adjusts a signal detected by the detector, and an image generation unit 211 that generates an image based on the adjusted signal. The computer system 231 includes a host computer 212 having a function of receiving the image from the image generation unit 211 and a function of transmitting an instruction to a control device 101 (however, the host computer 212 may not constitute a part of the charged particle beam system 100 or the computer system 231). The host computer 212 is connected to a storage device 213.

The computer system 231 includes the control device 101 that controls components of the scanning electron microscope 230. The control device 101 can be configured using, for example, a known computer including a calculation unit and a storage unit. The calculation unit includes, for example, a processor, and the storage unit includes, for example, a semiconductor memory.

FIG. 2 shows a configuration of a GUI 214 for moving the FOV in the first embodiment. By using the GUI 214, an operation method can be intuitively understood, and work can be efficiently advanced. The GUI 214 is displayed, for example, on the host computer 212, and the control device 101 moves the FOV in response to an operation on the GUI 214. This changes the region of the sample displayed in the FOV of the host computer 212. For example, when a user operates the GUI 214 on the host computer 212, the control device 101 controls the FOV position adjustment mechanism to move the FOV to a measurement target. This makes it possible to move a portion to be measured (a measurement region) into the FOV.

FIG. 3 shows a configuration of a GUI 215 for acquiring an image in the first embodiment. By using the GUI 215, the operation method can be intuitively understood, and the work can be efficiently advanced. The GUI 215 is displayed, for example, on the host computer 212, and the control device 101 acquires the image in the FOV in response to an operation on the GUI 215.

For example, when the user operates an imaging button 216 of the GUI 215 on the host computer 212, according to an instruction from the control device 101, the electron beam 202 emitted from the electron source 201 is accelerated by an acceleration electrode (not shown), passes through the objective lens 203, and is radiated onto the sample (the wafer) 232. In this way, the charged particle beam system 100 scans the sample with the electron beam 202 (a charged particle beam). A configuration for performing scanning in the charged particle beam system 100 is implemented, for example, as a scanner including the electron source 201, the aligner 222, the scanning deflector 233 and the image shift deflector 208.

Next, the backscattered electron detector 204 or the secondary electron detector 205 detects the charged particles emitted from the sample during an operation of the electron beam 202. The charged particles emitted from the sample include at least one of the backscattered electrons detected by reflecting the electron beam 202 and the secondary electrons emitted from the sample in response to the electron beam 202.

The backscattered electron detector 204 or secondary electron detector 205 detects the secondary electrons or the backscattered electrons 206, acquires a signal corresponding to a result, and outputs the signal. In this way, the charged particle beam system 100 acquires the signal corresponding to the detected charged particles.

This signal is adjusted by the signal adjustment device 207, and the image generation unit 211 generates the image based on the adjusted signal. In this way, the signal adjustment device 207 and the image generation unit 211 function as an image adjuster 234 that adjusts the signal corresponding to the detected charged particles to acquire the image. The image is transmitted to the host computer 212 and displayed in the FOV. In this way, a captured image 107 is an image acquired by the control device 101 adjusting the signal corresponding to the charged particles emitted from the sample when the sample is scanned with the charged particle beam.

FIG. 4 shows a configuration of a GUI 218 for setting an electron optical condition in the first embodiment. By using the GUI 218, the operation method can be intuitively understood, and the work can be efficiently advanced. The GUI 218 is displayed, for example, on the host computer 212, and the control device 101 sets or changes the electron optical condition in response to an operation on the GUI 218.

The GUI 218 includes an acceleration instruction unit 219 that instructs acceleration of the electron beam 202 (for example, a numerical value can be input), and an optics instruction unit 220 that instructs an optical condition (optics) (for example, a numerical value can be input or one of a plurality of conditions can be specified). The optical condition means, for example, a mode of the electron beam 202, and is related to how the image is viewed since a focus depth differs depending on the mode.

The user can change the electron optical condition such as the acceleration and the optical condition of the electron beam 202 in the GUI 218. When the acceleration or the optical condition is changed, the electron beam 202 may be displaced from a center of an optical axis. In this case, a relationship between the optical axis and the electron beam 202 can be adjusted by adjusting a current value of the aligner 222.

Figure 5B:
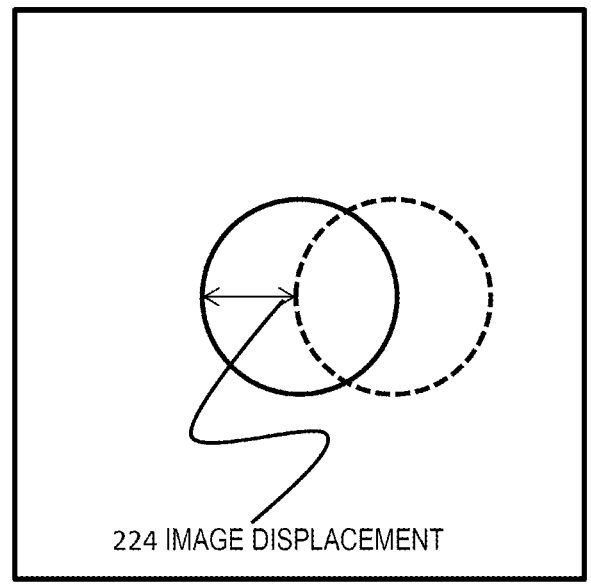

An action of the aligner 222 according to the first embodiment will be described with reference to FIG. 5. FIG. 5(*a*) shows a state 223 in which the electron beam 202 is tilted. FIG. 5(*b*) shows that the image is displaced due to tilt of the electron beam 202. The tilted electron beam 202 as shown in FIG. 5(*a*) is radiated not to a circular region represented by a solid line in a center of FIG. 5(*b*) but to a displaced circular region represented by a broken line. The action of the aligner 222 can eliminate or reduce such an image displacement 224.

When the optical axis is adjusted, it is possible to utilize a characteristic that a position of the image is not displaced even if a focus is changed when the electron beam 202 passes through the center of the optical axis. For example, a value of a current flowing through the objective lens 203 is changed along a sine curve, and the current value of the aligner 222 is changed so as to minimize the displacement of image acquired at that time.

This optical axis adjustment may be automatic or manual. When performing automatically, a button 221 for performing automatic optical axis adjustment is operated. When performing manually, the current value of the aligner 222 is adjusted by being changed from the GUI 218 (an operation unit for this may be provided in the GUI 218).

When the user who has visually recognized an image to be measured operates a button 217 for extracting a measurement region in the GUI 215 for acquiring the image, the control device 101 extracts the measurement region. In the present embodiment, the user manually specifies the measurement region to be extracted. For example, the user marks a contour of a specific region in an FOV 108 in the GUI 215 and operates the button 217 for extracting the measurement region. The control device 101 specifies and extracts a region surrounded by the contour as the measurement region in response to this.

The measurement region may be automatically specified and extracted by the control device 101 based on a known image processing technology. For example, when the user operates the button 217 for extracting the measurement region, the control device 101 automatically specifies and extracts the corresponding measurement region based on the known image processing technology and displays the measurement region on the GUI 215. In this way, the control device 101 functions as a measurement region acquirer that acquires the measurement region in the image.

Next, the signal adjustment device 207 adjusts a signal of the secondary electrons or the backscattered electrons 206 detected from the measurement region. Signal adjustment is performed, for example, by increasing or decreasing a bias of the signal and increasing or decreasing an amplitude thereof. Contrast and brightness adjustment can be achieved by adjusting such a signal. The image generation unit 211 generates the image using the adjusted signal.

FIG. 6 is a functional schematic diagram showing a part of image-related functions of the control device 101 provided in the charged particle beam system 100 according to the first embodiment. The control device 101 can adjust a contrast and brightness of the image and the focus, and in particular, can perform the adjustment for the measurement region present in a deep portion of the sample.

In the present specification, the "deep portion" means a region located deeper than a top portion of the sample in the FOV, and refers to, for example, a bottom portion of a concave structure (for example, a deep hole or a deep groove) on a surface of the sample. The "top portion" refers to the highest portion of the sample in the FOV, for example, a top surface of the sample when the sample has a flat top surface (refers to the highest portion or point when a height difference is present on the top surface). In the charged particle beam system 100, high and low directions can be appropriately defined by those skilled in the art, and for example, a direction of the electron source 201 or the objective lens 203 is defined as the "high" direction with respect to the stage 209.

The control device 101 can specify a measurement region 106 from a current captured image 107 of the sample 232, and perform centering processing 102 that moves the measurement region 106 into the FOV 108, extraction processing 103 that extracts the measurement region 106 from the image in FOV 108, ABCC 104 that adjusts the contrast and brightness for the measurement region 106, and AFC 105 that adjusts the focus for the measurement region 106.

In particular, the control device 101 can extract the measurement region in a field of view that has undergone the centering processing or the image that has undergone the centering processing. The control device 101 can adjust the contrast and brightness for the extracted measurement region. In addition, the control device 101 can adjust the focus for the measurement region in which the contrast and brightness have been adjusted.

The captured image 107 of the sample at each time point shown in FIG. 6 is generated by, for example, the image generation unit 211 (see FIG. 1). When all or a part of the measurement region 106 is present in the captured image 107, the control device 101 can acquire a position of the measurement region 106.

Here, a circular hole is formed on the surface of the sample, and the measurement region 106 is a region corresponding to a bottom surface thereof. However, with a related-art SEM, adjustment is performed such that only a surface of the pattern becomes clear, and an image focused on a bottom portion of the hole cannot be acquired. The captured image 107 at time points of the centering processing 102 and the extraction processing 103 in FIG. 6 is an image equivalent to the image acquired by the related-art SEM, and adjustment for the measurement region 106 is not performed. This state is represented by coloring the measurement region 106 in gray.

In the centering processing 102, the user inputs a positional displacement 110. This is done, for example, via an appropriate GUI on the host computer 212. The control device 101 performs correction according to the positional displacement 110. For example, the components of the scanning electron microscope 230 are adjusted according to the positional displacement 110 such that the entire measurement region 106 enters the FOV 108. In this way, the charged particle beam system 100 performs the centering processing 102 based on the measurement region 106.

Next, the extraction processing 103 of the measurement region will be described. The control device 101 extracts the measurement region 106 in the captured image 107. For example, a contour line 112 of the measurement region is acquired, and a region surrounded by the contour line 112 is defined as the measurement region 106.

Here, as shown in FIG. 7, a part of the measurement region 106 may be covered with an upper layer pattern 123. In such a case, since a method for extracting the contour line 112 is known, detailed description thereof will be omitted, but for example, a method described in PTL 2 can be used. That is, a contour line of a lower layer pattern can be extracted by creating synthetic thinned mask data from design data of the upper layer and design data of the lower layer and removing the upper layer pattern.

Next, the ABCC 104 will be described. The control device 101 performs the ABCC 104 by controlling the signal adjustment device 207 to adjust the signal.

An operation of the ABCC 104 in the first embodiment will be described with reference to FIG. 8. It is assumed that an amplitude of a signal 113 from the detector (for example, the backscattered electron detector 204 or the secondary electron detector 205) is relatively small and smaller than an amplitude of a target signal waveform 114. It is assumed that an average value 115 of intensity of the signal 113 (corresponding to the brightness of the image) is also relatively small and smaller than a target brightness 116.

The signal adjustment device 207 multiplies the signal 113 by a gain value (amplification degree) represented by a control signal to bring the amplitude of the signal 113 to match or be close to the amplitude of the target signal waveform 114. Thereby, the contrast in the measurement region 106 is adjusted. The signal adjustment device 207 adds a bias value represented by the control signal to the signal 113 to bring the average value 115 of the intensity to match or be close to the target brightness 116. Thereby, degree of the brightness in the measurement region 106 is adjusted.

In this way, the charged particle beam system 100 adjusts the contrast and brightness for the measurement region 106 and acquires an adjusted signal 117. In the image related to the adjusted signal 117, the measurement region 106 appears more clearly. This state is represented by whitening the measurement region 106 in FIG. 6. In a state immediately after the ABCC 104, the focus is not adjusted for the measurement region 106, and sharpness is not so high (represented by making a line in the measurement region 106 a broken line).

Next, the AFC 105 will be described. The control device 101 performs the AFC 105 by changing a focus adjustment value. The focus adjustment value is embodied as, for example, a mode of the electron beam 202, but may be embodied in other manners.

An operation of the AFC 105 in the first embodiment will be described with reference to FIG. 9. When the control device 101 changes a focus adjustment value 121 (a horizontal axis), sharpness 120 of the image (a vertical axis) changes. Therefore, in the AFC 105, the sharpness of each image is calculated while repeatedly acquiring the image while changing focus adjustment value 121 within the focus adjustment range 119, and the focus adjustment value (a target value 122) having the highest sharpness is set to a positive focus position. In this way, it can be said that the charged particle beam system 100 includes a focus adjuster that adjusts the focus for the measurement region. The focus adjuster may have a structure including mechanisms related to irradiation of the electron beam 202, the signal adjustment and image acquisition.

An image of any measurement region (for example, a region in the deep portion) in the measurement target can be sharpened by the AFC 105. This state is represented in FIG. 6 by making the line in the measurement region 106 a solid line.

In the ABCC 104 and the AFC 105, the target signal waveform 114, the target brightness 116 and the focus adjustment range 119 differ depending on the electron optical condition of the scanning electron microscope 230 (such as the acceleration and the optical condition of the electron beam 202). The control device 101 may pre-store the target signal waveform 114, the target brightness 116 and the focus adjustment range 119 for a specific or various electron optical conditions.

After that, the charged particle beam system 100 may perform length measurement in the measurement region 106. Here, as described above, since the measurement region 106 to be length-measured is clear, the length measurement can be performed under more favorable conditions.

The control device 101 and the image adjuster 234 described above can be implemented using a general-purpose computer, and may be realized as functions of a program performed on the computer. Therefore, FIG. 1 shows an example in which the components are implemented by the computer system 231. The computer system 231 includes at least a processor such as a central processing unit (CPU) and a storage unit such as a memory and/or a hard disk (including the storage device 213). For example, the computer system 231 may be configured as a multiprocessor system, the control device 101 may include a main processor, and the image adjuster 234 may include a subprocessor.

In this way, according to the charged particle beam system 100 according to the present embodiment, the user can set any measurement region 106 for the measurement target and perform ABCC and AFC on the measurement region 106. The measurement region 106 can be set, for example, in the deep portion of the measurement target, and more specifically, can be set at the bottom portion of the deep hole or the deep groove. In particular, since the measurement region 106 can be set on the image of the FOV 108 regardless of a depth thereof, the contrast and brightness as well as the focus can be appropriately adjusted for the measurement region 106 present in the deep portion even when the depth of the measurement region 106 is unknown.

Second Embodiment

In the first embodiment, the user manually specifies the measurement region 106. In a second embodiment, the charged particle beam system 100 automatically specifies and extracts the measurement region 106. Hereinafter, differences from the first embodiment will be described.

FIG. 10 is a flowchart showing an outline of processing performed by the charged particle beam system 100 for extracting the measurement region 106 in the second embodiment. The charged particle beam system 100 first creates a recipe in response to an operation of a user (step S100). The recipe is information including, for example, a procedure and parameters for automatically specifying the measurement region 106. In addition, the recipe may include a procedure, parameters and the like for automatically performing length measurement. The charged particle beam system 100 then performs the created recipe (step S200). Thereby, the measurement region 106 is specified.

FIG. 11 is a flowchart showing contents of step S100 in more detail. By this processing, an operation method can be intuitively understood, and work can be efficiently advanced. In step S100, the user inputs coordinates of a length-measurement point, and the charged particle beam system 100 receives and registers the coordinates of the length-measurement point (step S110). Here, the user moves an FOV position using the GUI 214 for moving the FOV (FIG. 2).

FIG. 12 shows a configuration of an image display GUI 317 used in step S110. By using the GUI 317, the operation method can be intuitively understood, and the work can be efficiently advanced. The GUI 317 is displayed, for example, on the host computer 212, and the FOV displayed on the image display GUI 317 changes in response to an operation on the GUI 214 for moving the FOV.

FIG. 13 shows a configuration of a GUI 308 for creating a recipe, which is used in step S110. By using the GUI 308, the operation method can be intuitively understood, and the work can be efficiently advanced. The GUI 308 is displayed, for example, on the host computer 212. While an image 321 to be used for the length measurement is displayed on the image display GUI 317, the user operates a length-measurement point registration button 329 of the GUI 308 for creating the recipe. The charged particle beam system 100 registers the FOV position at a time point when the length-measurement point registration button 329 is operated as the coordinates of the length-measurement point. The FOV position is displayed, for example, as coordinates 326 of the FOV position.

Next, the charged particle beam system 100 registers a template image and registers the measurement region (step S120).

FIG. 14 is a flowchart showing contents of step S120 in more detail. By this processing, the work can be efficiently advanced. The user operates an ABCC button 318 and an AFC button 319 in the image display GUI 317 (FIG. 12). The charged particle beam system 100 performs the ABCC on the image 321 in response to an operation on the ABCC button 318 (step S121). In addition, the charged particle beam system 100 performs the AFC on the image 321 in response to an operation on the AFC button 319 (step S122).

If the image that has undergone the ABCC and the AFC is blurry, the user may operate an image filter button 320 as needed. The charged particle beam system 100 applies an image filter to the image 321 when the image filter button 320 is operated (step S123).

FIG. 15 shows a configuration of a template setting GUI 310 for registering the template image, which is used in step S120. By using the template setting GUI 310, the operation method can be intuitively understood, and the work can be efficiently advanced. The template setting GUI 310 is displayed, for example, on the host computer 212. The user operates a template image registration button 311 in the template setting GUI 310. The charged particle beam system 100 registers an image at that time as a template image 109 in response to an operation on the template image registration button 311 (step S124). This processing may be performed in response to an operation on a template setting button 309 of the GUI 308 (FIG. 13).

The template image 109 displayed on the template setting GUI 310 can be selected from, for example, images the same as the image 321 in the image display GUI 317. The user can determine the template image 109 such that the entire desired measurement region 106 is present in the template image 109.

Next, the user may operate a centering operation confirmation button 315. The charged particle beam system 100 may perform centering processing (for example, the centering processing 102 in FIG. 6) in response to an operation on the centering operation confirmation button 315. This allows the user to confirm that the template image can be correctly used. If a result of performing the centering processing is incorrect, the user can perform step S124 again.

Next, the user operates a measurement region setting button 314. The charged particle beam system 100 specifies a measurement region in the template image 109 in response to an operation on the measurement region setting button 314, thereby tentatively determining the measurement region (step S125). The charging particle beam system 100 automatically specifies the measurement region in the template image 109.

This processing can be performed based on the known image processing technology, for example, by specifying a region corresponding to a structure appearing at or near a center of the template image 109. As a more specific example, the charged particle beam system 100 may extract a closed contour at or near the center of the template image 109, and specify inside of the closed contour as a measurement region.

In the present embodiment, the charged particle beam system 100 automatically specifies the measurement region, but as a modification, the user may manually specify the measurement region as in the first embodiment. In this case, the measurement region may be specified by the user drawing the measurement region in the template image 109. The user may operate a measurement region extraction confirmation button 316 after manually drawing the measurement region. The SEM may extract the measurement region in response to an operation on the measurement region extraction confirmation button 316, and display the extracted measurement region. In this way, it is possible to confirm whether the measurement region can be correctly extracted.

Next, the user operates a button 327 for performing the ABCC. The charged particle beam system 100 performs the ABCC on the measurement region in response to an operation on the button (step S126). Here, instead of or in addition to the automatic ABCC performed by the charged particle beam system 100, the user may manually perform the ABCC.

FIG. 16 shows a configuration of an ABCC adjustment GUI 330 used in step S126. By using the ABCC adjustment GUI 330, the operation method can be intuitively understood, and the work can be efficiently advanced. The ABCC adjustment GUI 330 is displayed, for example, on the host computer 212. The user may operate a brightness adjustment unit and a contrast adjustment unit in the ABCC adjustment GUI 330. The charged particle beam system 100 increases brightness in response to an operation on the brightness adjustment unit on one side, and reduces the brightness in response the operation on the brightness adjustment unit on the other side. In addition, the SEM enhances a contrast in response to an operation on the contrast adjustment unit on one side, and weakens the contrast in response to the operation on the contrast adjustment unit on the other side.

Next, the user operates a button 328 for performing the AFC. The charged particle beam system 100 performs the AFC on the measurement region in response to an operation on the button (step S127). Here, the user may confirm that the AFC is correctly performed, and when the AFC is not correctly performed, the ABCC may be manually performed and then the AFC may be performed again.

Next, the user operates a measurement region determination button 325. The charged particle beam system 100 determines the measurement region in response to an operation on the button (step S128). In step S128, the charged particle beam system 100 generates information including the coordinates of the length-measurement point, the template image, and the measurement region in the template image as the recipe. In this way, processing of step S120 ends.

Finally, the user operates a recipe registration button 331 in the GUI 308 for creating the recipe. The charged particle beam system 100 registers the recipe created in step S120 in response to an operation on the button (step S130). By this registration, the recipe is stored in, for example, the storage device 213. In this way, step S100 ends.

In the flowchart in FIG. 10, the user then causes the charged particle beam system 100 to perform the recipe (step S200). This is performed, for example, through an operation in the host computer 212.

FIG. 17 is a flowchart showing contents of step S200 in more detail. By this processing, the work can be efficiently advanced. Although not particularly shown, when step S200 is performed, the control device 101 reads information included in the recipe from the storage device 213.

In step S200, first, the charged particle beam system 100 introduces a sample (step S201). For example, the charged particle beam system 100 is provided with an automatic sample transfer device that places the sample (the wafer) 232 installed in a sample storage container (a front opening unify pod: FOUP) on the stage 209 (not shown), and the sample (the wafer) 232 is placed on the stage 209 via the automatic sample transfer device. In this case, the computer system 231 also controls loading and unloading of the sample by the automatic sample transfer device. Alternatively, the user may directly place the sample (the wafer) 232 on the stage 209.

Next, the charged particle beam system 100 performs alignment processing (step S202). This is performed, for example, by operating the stage 209 to change a tilt of the sample.

Next, the charged particle beam system 100 performs addressing processing (step S203). This is the processing of roughly setting a position of the length-measurement point, and is performed, for example, by moving the length-measurement point in or near the FOV. Next, the charged particle beam system 100 moves the FOV according to the length-measurement point registered in the recipe (step S204). This may be performed as a part of step S203.

Next, the charged particle beam system 100 acquires an image in the FOV (step S205). Next, the charged particle beam system 100 performs the ABCC on the acquired image (step S206). This is performed, for example, in the same manner as the ABCC 104 (FIG. 6) according to the first embodiment. In this way, the adjusted image is acquired. Next, the charged particle beam system 100 performs the AFC on the adjusted image (step S207). This is performed, for example, in the same manner as the AFC 105 (FIG. 6) according to the first embodiment.

Next, the charged particle beam system 100 performs pattern matching processing based on the image after the AFC is performed and the template image 109 registered in the recipe (step S208). Thereby, the charged particle beam system 100 calculates the positional displacement 110 (FIG. 6) of the measurement region 106. In this way, in the present embodiment, the charged particle beam system 100 automatically acquires the measurement region 106 based on the image.

The subsequent processing can be the same as that of the first embodiment. For example, the charged particle beam system 100 specifies a position of the measurement region (step S209), performs the centering processing (step S210), extracts the measurement region (step S211), performs the ABCC on the measurement region (step S212), performs the AFC on the measurement region (step S213), and performs the length measurement on a length-measurement target (step S214).

In this way, according to the charged particle beam system 100 according to the present embodiment, the measurement region can be automatically determined, and the centering processing can be automatically performed, so that an effort of the user can be reduced. In addition, as in the first embodiment, the contrast and brightness as well as the focus can be appropriately adjusted for the measurement region present in a deep portion even when a depth of the measurement region is unknown.

Third Embodiment

In a third embodiment, overlay measurement is performed in the first or second embodiment. Such an embodiment is useful when a measurement region specified according to a recipe has an overlay. Hereinafter, differences from the first or second embodiment will be described.

The overlay measurement will be described with reference to FIG. 18. In an example in FIG. 18, a pattern 401 of a sample has a structure 405 of an upper layer portion (for example, a hole formed on a surface) and a structure 406 of a lower layer portion (for example, a bottom surface of the hole), and a gravity center 402 of the upper layer portion (for example, a gravity center of the structure 405 of the upper layer portion) and a gravity center 403 of the lower layer portion (for example, a gravity center of the structure 406 of the lower layer portion) do not match. In such a case, processing of measuring a displacement 404 between the gravity center 402 of the upper layer portion and the gravity center 403 of the lower layer portion is an example of the overlay measurement.

In the present specification, a term "gravity center" means a gravity center of a region on an image, not a gravity center of the sample. For example, as shown in FIG. 18, the gravity center of a disk-shaped region matches a center of a circle.

FIG. 19 is an example of an image acquired corresponding to the pattern 401 in FIG. 18. In this image, a focus is adjusted for the lower layer portion. Here, although the lower layer portion is present in a deep portion of the sample, as described in the first or second embodiment, the charged particle beam system 100 can specify the structure 406 of the lower layer portion as a measurement region and clearly acquire an image of the structure 406 of the lower layer portion. Therefore, not only a position of the gravity center 402 of the upper layer portion but also a position of the gravity center 403 of the lower layer portion can be accurately acquired, and the overlay can be accurately measured.

FIG. 20 shows a configuration of a recipe creation GUI 407 for the overlay measurement according to the third embodiment. By using the GUI 407, an operation method can be intuitively understood, and work can be efficiently advanced. The GUI 407 is displayed, for example, on the host computer 212, and the control device 101 creates the recipe for the overlay measurement in response to an operation on the GUI 407.

For example, a user can individually specify a detector used for acquiring an image for the upper layer portion and a detector used for acquiring an image for the lower layer portion by operating the GUI 407 on the host computer 212. The control device 101 registers information indicating the detectors used respectively for the structure 405 of the upper layer portion and the structure 406 of the lower layer portion in the recipe in response to an operation on the GUI 407. In an example in FIG. 20, the image for the structure 405 of the upper layer portion is acquired by the secondary electron detector 205, and the image for the structure 406 of the lower layer portion is acquired by the backscattered electron detector 204.

In this way, the charged particle beam system 100 according to the present embodiment can perform the overlay measurement. Automatic determination can be performed. As in the first embodiment, a contrast and brightness as well as a focus can be appropriately adjusted for the measurement region present in the deep portion even when a depth of the measurement region (in particular, the measurement region in the structure 406 of the lower layer portion) is unknown.

While the embodiments of the disclosure have been described, these embodiments have been presented by way of example only, and are not intended to limit the scope of the invention. These novel embodiments can be implemented in various other forms and various omissions, substitutions and changes can be made without departing from the spirit of the invention. These embodiments and modifications thereof are included in the scope and spirit of the invention, and are also included in the invention described in the claims and equivalents thereof.

REFERENCE SIGN LIST

100 charged particle beam system (pattern measurement system)
101 control device
102 centering processing
103 extraction processing
104 ABCC
105 AFC
106 measurement region
107 captured image
108 FOV
109 template image
112 contour line
201 electron source
202 electron beam
203 objective lens
204 backscattered electron detector
205 secondary electron detector
206 secondary electron or backscattered electron
207 signal adjustment device
208 image shift deflector
209 stage
211 image generation unit
212 host computer
213 storage device
214, 215, 218, 308, 310, 317, 330, 407 GUI
230 scanning electron microscope (pattern measurement device)
231 computer system
232 sample (wafer)
233 scanning deflector
234 image adjuster

The invention claimed is:

1. A method for image adjustment performed by a computer system controlling a charged particle beam device, the method for image adjustment comprising:
by the computer system,
specifying a measurement region from a captured image of a sample;
performing centering processing based on the specified measurement region;
extracting the measurement region in a field of view that has undergone the centering processing or the image that has undergone the centering processing;
adjusting a contrast and brightness for the extracted measurement region; and
adjusting a focus for the measurement region in which the contrast and brightness have been adjusted.

2. The method according to claim 1, wherein
the captured image is an image acquired, when the sample is scanned with a charged particle beam, by the computer system adjusting a signal corresponding to charged particles emitted from the sample.

3. The method according to claim 2, further comprising:
by the computer system, displaying a GUI including an imaging button, wherein
the computer system performs scanning on the sample with the charged particle beam in response to an operation on the imaging button.

4. The method according to claim 1, wherein
when acquiring the measurement region, the computer system automatically acquires the measurement region based on the image.

5. The method according to claim 1, wherein
the measurement region is a region located deeper than a top portion of the sample.

6. The method according to claim 1, further comprising:
by the computer system, displaying a GUI configured to move the FOV.

7. The method according to claim 1, further comprising:
by the computer system, displaying a GUI configured to set or change an electron optical condition.

8. The method according to claim 1, further comprising:
by the computer system, creating a recipe including a procedure and parameters for automatically specifying the measurement region in response to an operation of a user.

9. The method according to claim 8, further comprising:
by the computer system, displaying a GUI configured to display the FOV.

10. The method according to claim 8, further comprising:
by the computer system, displaying a GUI configured to register coordinates of a length-measurement point.

11. The method according to claim 8, further comprising:
by the computer system, registering a template image.

12. The method according to claim 11, further comprising:
by the computer system, displaying a template setting GUI configured to register the template image.

13. The method according to claim 11, further comprising:
by the computer system, displaying a GUI configured to adjust a contrast and brightness.

14. The method according to claim 8, further comprising:
by the computer system, displaying a GUI configured to create a recipe for overlay measurement.

15. The method according to claim 1, further comprising:
by the computer system, performing a recipe including a procedure and parameters for automatically specifying the measurement region.

16. A charged particle beam system comprising:
a charged particle beam device; and
a computer system, wherein
the computer system is configured to, by controlling the charged particle beam device,
specify a measurement region from a captured image of a sample,
perform centering processing based on the specified measurement region,
extract the measurement region in a field of view that has undergone the centering processing or the image that has undergone the centering processing,
adjust a contrast and brightness for the extracted measurement region, and adjust a focus for the measurement region in which the contrast and brightness have been adjusted.

\* \* \* \* \*